United States Patent
Hata et al.

[11] Patent Number: 5,441,913
[45] Date of Patent: Aug. 15, 1995

[54] PROCESS OF MAKING A SEMICONDUCTOR EPITAXIAL SUBSTRATE

[75] Inventors: Masahiko Hata; Noboru Fukuhara; Hiroaki Takata; Katsumi Inui, all of Tsukuba, Japan

[73] Assignee: Sumitomo Chemical Company, Limited, Osaka, Japan

[21] Appl. No.: 266,680

[22] Filed: Jun. 28, 1994

[30] Foreign Application Priority Data

Jun. 28, 1993 [JP] Japan ................................ 5-156850

[51] Int. Cl.$^6$ ................................ H01L 21/20
[52] U.S. Cl. ................ 437/133; 437/107; 437/126; 148/33.4; 148/33.5; 148/33.6
[58] Field of Search ............. 437/107, 133; 148/33.5, 148/33.4, 33.6, DIG. 65, DIG. 66

[56] References Cited

U.S. PATENT DOCUMENTS

| | | | |
|---|---|---|---|
| 4,207,122 | 6/1980 | Goodman | 148/33.4 |
| 4,233,090 | 11/1980 | Hawrylo et al. | 148/33.5 |
| 4,827,320 | 5/1989 | Morkoc et al. | 257/18 |
| 4,833,101 | 5/1989 | Fujii | 437/110 |
| 5,298,441 | 3/1994 | Goronkin et al. | 437/133 |

FOREIGN PATENT DOCUMENTS

| | | | |
|---|---|---|---|
| 0461766 | 12/1991 | European Pat. Off. | 148/33.4 |
| 0539693 | 5/1993 | European Pat. Off. | |
| 0098215 | 4/1989 | Japan | 437/133 |
| 3022541 | 1/1991 | Japan | 148/33.4 |
| 4025120 | 1/1992 | Japan | 437/107 |
| 4186824 | 7/1992 | Japan | 437/107 |
| WO9113466 | 9/1991 | WIPO | |

OTHER PUBLICATIONS

Patent Abstracts of Japan, vol. 16, No. 158, Apr. 17, 1992, p. 116 E 1191; & JP-A-04 10 684.
Patent Abstracts of Japan, vol. 14, No. 568, Dec. 18, 1990, p. 43 E 1014; & JP-A-02 246 344 (Sonyo).
Patent Abstracts of Japan, vol. 17, No. 156, Mar. 26, 1993, p. 117 E 1341; & JP-A-04 321 239 (Sonyo).

*Primary Examiner*—R. Bruce Breneman
*Assistant Examiner*—Ramamohan Rao Paladugu
*Attorney, Agent, or Firm*—Sughrue, Mion, Zinn, Macpeak & Seas

[57] ABSTRACT

A semiconductor epitaxial substrate and a process for producing the same, the semiconductor epitaxial substrate comprising a GaAs single-crystal substrate having thereon an $In_yGa_{(1-y)}As$ ($0 < y \leq 1$) crystal layer as a channel layer, the composition and the thickness of the $In_yGa_{(1-y)}As$ layer being in the ranges within the elastic deformation limit of crystals constituting the $In_yGa_{(1-y)}As$ layer and the vicinity of the $In_yGa_{(1-y)}As$ layer, the semiconductor epitaxial substrate further comprising a semiconductor layer between the channel layer and an electron donating layer for supplying electrons to the channel layer, the semiconductor layer having a thickness of from 0.5 to 5 nm and a bandgap width within the range of from the bandgap width of GaAs to the bandgap width of the electron donating layer.

7 Claims, 1 Drawing Sheet

PROCESS OF MAKING A SEMICONDUCTOR EPITAXIAL SUBSTRATE

FIELD OF THE INVENTION

The present invention relates to a semiconductor epitaxial substrate and a process for producing the same. The semiconductor epitaxial substrate is formed on a single-crystal gallium arsenide (hereinafter referred to as "GaAs") substrate by en epitaxial growing method.

BACKGROUND OF THE INVENTION

Various electronic elements using semiconductors have recently progressed and the industrial field thereof has been inspected to steadily progress hereafter. As the semiconductor which is a basic material of the industrial field, silicon has been mainly used recently but at present, a compound semiconductor (e.g., GaAs) excellent in light emitting characteristics and high-speed property is steadily progressed.

Various kinds of electronic elements having a desired performance can be generally obtained by applying crystal layers having necessary characteristics to a single crystal substrate by various methods, such as an ion injection method, a diffusion method, an epitaxial growing method, etc. In these methods, the epitaxial growing method has been widely used since the method can accurately control not only the amount of impurities but also the composition and layer thickness of the crystal layer in a wide range.

Known examples of the epitaxial growing method include a liquid phase method, a vapor phase method, and a molecular beam epitaxial method (hereinafter referred to as "MBE method") which is one of vacuum vapor deposition methods. In particular, since the vapor phase method can process a large amount of substrates with a good controlling property, the vapor phase method has been widely used in an industrial scale. Among the vapor phase methods, a metal-organic chemical vapor deposition method (hereinafter referred to as "MOCVD method") has recently been widely used.

A high electron mobility transistor (hereinafter sometimes referred to as "HEMT", which is also sometimes called modulation doped field effect transistor (MODFET) or hetero-junction field effect transistor (HJFRT), which is important as a part for constituting a low-noise amplifier for a microwave communication, is one of electric field effect transistors. The crystals used in the electric field effect transistors can be prepared by growing laminated layers of a GaAs crystal and an AlGaAs crystal having necessary electronic characteristics on a GaAs substrate to have necessary structures by the vapor phase method as described above.

As the materials used for preparing these elements, GaAs series materials and AlGaAs series materials have been widely used, since the crystal constants can coincide with each other in optional compositions and various kinds of heterojunctions are possible for them while keeping the good crystalline properties.

Since $In_yGa_{(1-y)}As$ ($0 < y \leq 1$) is excellent in the electron transporting characteristics and can greatly change the energy gap according to the composition, it has excellent properties as a hetero-junction material. However, since the lattice conformity to GaAs is impossible, an InP substrate to which the lattice conformity is possible at the value of y of about 0.49 has hitherto been mainly used.

With the recent progress of techniques in this field, it has been clarified that even in a lattice unconformity system, a reliable hetero-junction is possible without causing the undesirable deterioration of crystalline property, such as the occurrence of dislocation, etc., if the crystals are within the limit of the elastic deformation by controlling the composition and layer thickness.

By utilizing a strained layer within such specific ranges of composition and layer thickness, even in an epitaxial substrate using the GaAs substrate, a substrate having the InGaAs layer at a part of the epitaxial substrate can be produced. For example, under the ordinary crystal growing condition, an $In_yGA_{(1-y)}As$ layer of $y = 0.15$ and of about 15 nm in layer thickness can be grown on the GaAs substrate without deterioration of the crystalline property. By employing the epitaxial substrate having such a structure that the $In_yGa_{(1-y)}As$ layer is inserted between a GaAs buffer layer and an n-type AlGaAs electron donating layer, an HEMT excellent in noise characteristics as compared with conventional ones can be produced.

The epitaxial substrate using GaAs as the substrate and containing the strained layer of InGaAs at a part thereof has been produced by the MBE method or the MOCVD method as described above. However, there are problems in the properties and the productivity of the element using the epitaxial substrate. That is, the MBE method is an epitaxial growing method excellent in the thin layer controlling property, but the crystal formed by the MBE method has many surface defects, thereby there is a problem in the yield of the elements produced and also there is a problem in the productivity since the crystal growing speed is slow and the MBE method requires a super-high vacuum.

The MOCVD method is excellent in the productivity and the epitaxial substrate obtained by the MOCVD method has less surface defects. However, there is a problem in that the characteristics of the element using the resulting epitaxial substrate are not always satisfactory. In the case of using the epitaxial substrate prepared under an ordinary crystal growing condition by the MOCVD method, for example, in the case of an $In_{0.15}Ga_{0.85}As$ layer, the layer thickness deviates from 15 nm (the desired value) to have unevenness of about 2 to 5 nm at a period of from 200 to 400 nm. The inventors have found a problem in that the mobility of the two dimensional electron gas traveling in the InGaAs layer is lowered by the influence of the unevenness.

SUMMARY OF THE INVENTION

An object of the present invention is to provide a semiconductor epitaxial substrate in which the unevenness of the growing interface of an $In_yGa_{(1-y)}As$ ($0 < y \leq 1$) layer, which is a channel layer, i.e., the surface of the layer is flatted to improve the two dimensional electron gas mobility.

Another object of the present invention is to provide a production process of the above semiconductor epitaxial substrate.

Other objects and effects of the present invention will be apparent from the following description.

The present invention provides, as an aspect (1), a semiconductor epitaxial substrate comprising a GaAs single-crystal substrate having thereon an $In_yGa_{(1-y)}As$ ($0 < 1 \leq 1$) crystal layer as a channel layer, the composition and the thickness of the $In_yGa_{(1-y)}As$ layer being in the ranges within the elastic deformation limit of crystals constituting the In$_y$Ga$_{(1-y)}$As layer and the vicinity of the In$_y$Ga$_{(1-y)}$As layer, the semiconductor epitaxial substrate further comprising a semiconductor layer between the channel layer and an electron donating layer for supplying electrons to the channel layer, the semiconductor layer having a thickness of from 0.5 to 5 nm and a bandgap width within the range of from the bandgap width of GaAs to the bandgap width of the electron donating layer.

The present invention also provides, as an aspect (2), a semiconductor epitaxial substrate of the aspect (1), wherein the semiconductor layer is a GaAs layer.

The present invention further provides, as an aspect (3), a semiconductor epitaxial substrate of the aspect (1) or (2), wherein the electron donating layer is an Al$_x$Ga$_{(1-x)}$As ($0<x\leq1$) layer.

The present invention still further provides, as an aspect (4), a process for producing the semiconductor epitaxial substrate of the aspects (1), (2), and (3), which comprises the steps of: epitaxially growing the channel layer and the semiconductor layer at a temperature of not higher than 625° C. and epitaxially growing the electron donating layer at a temperature of at least 650° C.

The present invention still further provides, as an aspect (5), a process for producing the semiconductor epitaxial substrate of the aspect (4), wherein the epitaxial growing is conducted by a vapor phase thermally decomposition method using an organometal and/or a metal hydride as a starting material.

DETAILED DESCRIPTION OF THE INVENTION

Figure 1:
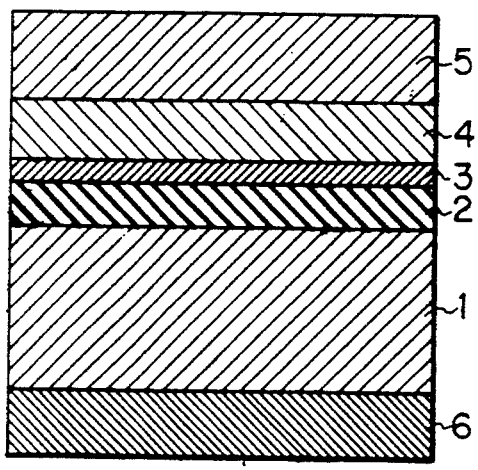
FIG. 1 is an enlarged schematic cross sectional view showing the semiconductor epitaxial substrate of this invention prepared in Example 1.

The semiconductor epitaxial substrate of the present invention is formed on a GaAs single-crystal substrate and has an In$_y$Ga$_{(1-y)}$As ($0<y\leq1$) crystal layer as a channel layer. The composition and the thickness of the In$_y$Ga$_{(1-y)}$As layer are within the ranges of the elastic deformation limit of the crystals constituting the In$_y$Ga$_{(1-y)}$As layer and the vicinity of the layer.

The ranges within the elastic deformation limit can be determined from the relationship of the composition and the layer thickness. The range within the elastic deformation limit of InGaAs to GaAs can be calculated from the following formula (1) given by Mathews et al, *J. Crystal Growth*, vol. 27, p. 118 (1974) and ibid., vol. 32, p. 265 (1974):

$$y = \frac{a(1-\sigma/4)[\ln(Lc\sqrt{2}/a)+1]}{0.14\sqrt{2}\,\pi Lc(1+\sigma)} \quad (1)$$

wherein Lc represents a critical layer thickness, a represents a lattice constant of GaAs, and $\sigma$ represents Poisson ratio.

The semiconductor epitaxial substrate of the present invention further comprises a semiconductor layer between the channel layer and an electron donating layer for supplying electrons to the channel layer. The semiconductor layer has a thickness of from 0.5 to 5 nm and a bandgap width within the range of from the bandgap width of GaAs to the bandgap width of the electron donating layer.

When the semiconductor layer has a bandgap width less than the bandgap width of GaAs, the proportion of the two dimensional electron gas traveling in the semiconductor is increased, whereby the proportion of the two dimensional electron gas traveling in the InGaAs layer excellent in electron transporting property is undesirably decreased.

When the semiconductor layer has a bandgap width over the bandgap width of the semiconductor constituting the electron donating layer, the supply of the two dimensional electron gas from the electron donating layer to the channel layer is restrain by the semiconductor layer as a barrier, whereby it becomes undesirably difficult to obtain the sufficient two dimensional electron gas.

The semiconductor layer has a thickness of from 0.5 to 5 nm, and preferably from 1 to 3 nm. If the thickness thereof is thinner than 0.5 nm, it becomes insufficient to reduce the unevenness of the InGaAs layer. The thickness thereof is over 5 nm, the distance between the electron donating layer and the channel layer is increased, whereby the proportion of the two dimensional electron gas traveling in the semiconductor layer is increased and the proportion the two dimensional electron gas traveling in the InGaAs layer excellent in the electron transporting property is undesirably decreased.

Examples of the electron donating layer of the semiconductor epitaxial substrate of the present invention include semiconductor crystals such as Al$_x$Ga$_{(1-x)}$As ($0x\leq1$), Al$_x$Ga$_{(1-x)}$As$_y$P$_{(1-y)}$ ($0\leq x\leq1$, $0\leq y\leq1$), and ZnS$_x$Se$_{(1-x)}$ ($0\leq x\leq1$). In these semiconductor crystals, Al$_x$Ga$_{(1-x)}$As ($0<x\leq1$) is preferred since the lattice constant thereof can coincide with that of GaAs and the production of the hetero-junction, with Al$_x$Ga$_{(1-x)}$As ($0.1\leq x\leq0.3$) being particularly preferred.

The process for producing the semiconductor epitaxial substrate of the present invention is described in detail below.

As an epitaxial growing method, a vapor phase method (e.g., a molecular beam epitaxial (MBE) method) or a vacuum vapor deposition method can be used. In particular, the vapor phase method is preferred since a large amount of substrates can be treated with a good controlling property. In the vapor phase methods, a metalorganic chemical vapor deposition method (MOCVD method), in which an organometal compound and/or a metal hydride of the atomic species constituting the epitaxial layer are used as starting materials and thermally decomposed on the substrate to perform the crystal growth, is particularly preferred, since the method can be applied for wide range of materials and is suitable for accurately controlling the composition of the crystal and the layer thickness.

The In$_y$Ga$_{(1-y)}$As layer as the channel layer and the semiconductor layer having the specific bandgap width provided between the channel layer and the electron donating layer are epitaxially grown at a temperature of not higher than 625° C., and more preferably not higher than 600° C. If the growing temperature of these layers is over 625° C., the unevenness of the interface of the epitaxial growth is undesirably increased.

The electron donating layer is epitaxially grown at a temperature of at least 650° C., and preferably at least 675° C. If the growing temperature of the layer is lower than 650° C., the amount of the acceptor impurity entering the electron donating layer on crystal growing is increased to undesirably reduce the amount of the electrically active and effective donor impurity, and further the acceptor impurity becomes the center of electron scattering to deteriorate the electric characteristics of the resulting element.

Other layer(s) than the $In_xGa_{(1-x)}As$ layer as the channel layer, the semiconductor layer, and the electron supplying layer can be epitaxially grown in the temperature range of generally from 600° to 800° C., and preferably from 650° C. to 800° C.

The semiconductor epitaxial substrate of the present invention can be obtained by laminating various kinds of epitaxial crystals on a GaAs single-crystal substrate. For example, in the case of using the combination of crystals of GaAs, $Al_xGa_{(1-x)}As$ ($0<x\leq1$), and $In_yGa_{(1-y)}As$ ($0<y<1$), the semiconductor epitaxial substrate of this invention can be produced by growing the layers of these crystals on the GaAs single-crystal substrate in the following manner:

(1) The surface of a semi-insulating GaAs single-crystal substrate having a high resistance is subjected to degreas-washing, etching, water-washing, and drying, and the substrate is placed on a stand in a crystal growing furnace.

(2) After sufficiently replacing the inside atmosphere of the furnace with high-purity hydrogen, the furnace is heated. An arsenic starting material is introduced into the furnace at the temperature range of generally from 600° to 800° C., and preferably from 650° to 800° C., and then a gallium starting material is introduced therein, to grow a non-doped GaAs layer (buffer layer) over a necessary time to make the thickness of from 0.1 to 2 μm. In place of the non-doped GaAs layer, a non-doped $Al_xGa_{(1-x)}As$ ($0<x\leq1$) layer or an alternately laminated structure of non-doped $Al_xGa_{(1-x)}As$ ($0<x\leq1$) and non-doped GaAs may be employed as a buffer layer.

(3) After lowering the temperature below 625° C., preferably below 600° C., an indium starting material is added thereto to grow a non-doped $In_yGa_{(1-y)}As$ ($0<y\leq1$, preferably $0.1\leq y\leq0.3$) layer (channel layer) to 5 to 25 nm, and successively a non-doped $Al_xGa_{(1-x)}As$ ($0\leq x\leq0.3$, provided that x is smaller than the composition of Al of an n-type AlGaAs layer grown successively) layer (semiconductor layer) is grown to 0.5 to 5 nm without interrupting growing. In this case, it is more preferred that x of the non-doped $Al_xGa_{(1-x)}As$ is 0, i.e., GaAs.

It is preferred that the non-doped $In_yGa_{(1-y)}As$ layer (channel layer) and the non-doped $Al_xGa_{(1-x)}As$ layer (semiconductor layer) are continuously grown without substantial interruption of crystal growth. For example, an aluminum starting material is supplied simultaneously with stopping the supply of the indium starting material.

(4) After stopping the supply of the indium starting material and increasing the temperature to at least 650° C., preferably at least 675° C., an aluminum starting material is added and non-doped high purity $Al_xGa_{(1-x)}As$ ($0.1\leq x\leq0.3$) is grown to a thickness of from 1 to 2 nm. This layer may be omitted. An n-type dopant is then added to grow an n-type $Al_xGa_{(1-x)}As$ ($0.1\leq x\leq0.3$) layer (electron donating layer) having a carrier concentration of from $1\times10^{18}$ to $3\times10^{18}/cm^3$ to a thickness of from 30 to 50 nm. After stopping the supply of the aluminum starting material, n-type GaAs having a carrier concentration of from $2\times10^{18}$ to $10\times10^{18}/cm^3$ is grown to a thickness of from 30 to 200 nm.

(5) The supply of the gallium starting material is stopped and then the supply of the arsenic starting material is stopped to terminate the crystal growth. After cooling, the resulting epitaxial substrate is took out from the furnace to complete the crystal growth.

As the arsenic starting material, arsenic trihydride (arsine) is preferably used but a monoalkylarsine (substituting an alkyl group having from 1 to 4 carbon atoms for one hydrogen of arsine) can be used.

As the starting materials for gallium, indium, and aluminum, a trialkyl or trihydride compound formed by bonding an alkyl group having from 1 to 3 carbon atoms or hydrogen to each metal atom, and a compound formed by coordinating, on the trialkyl or trihydride compound, a trialkyl compound composed of an alkyl group having from 1 to 4 carbon atom and nitrogen or an element selected from phosphorus and arsenic are preferably used.

As the n-type dopant, a hydride of silicon, germanium, tin, sulfur, selenium, etc., and an alkylated compound thereof having an alkyl group having from 1 to 3 carbon atoms are preferably used.

The composition and the layer thickness of each layer of the foregoing semiconductor epitaxial substrate are shown as an example, and can be actually selected in various ranges according to the required characteristics of the element.

In the GaAs substrate being used for the growth of crystals, the angle inclined from the azimuth and the azimuth are not restricted, if the main face azimuth is the {100} face. Examples of the azimuth of the GaAs substrate include the ($0\bar{1}1$) direction or the azimuth crystallographically equivalent thereto, the ($0\bar{1}\bar{1}1$) direction perpendicular to the above direction or the azimuth crystallographically equivalent thereto, the (110) direction which has hitherto been used or the azimuth crystallographically equivalent thereto, etc. In these directions of the azimuths, the face azimuth of the substrate is preferably the ($0\bar{1}1$) direction or the azimuth crystallographically equivalent thereto for obtaining a higher flatness of the InGaAs layer or the high two dimensional electron gas mobility.

The semiconductor epitaxial substrate produced as described above is excellent in the flatness of the interface between the channel InGaAs layer and the electron donating layer as compared with conventional substrates and also has a high electron mobility as compared with conventional ones, whereby highly improved device characteristics can be expected.

The present invention will be described in more detail by referring to the following examples and comparative examples, but the present invention is not construed as being limited to these example.

EXAMPLE 1

As a GaAs substrate, the substrate inclined at an angle of 0.5° to the $(0\bar{1}1)$ direction from the {100} face was used.

The following starting materials were used in the metalorganic chemical vapor decomposition method:

Trimethylgallium ($6 \times 10^{-5}$ to $23 \times 10^{-5}$ mol/min)
Trimethylaluminum ($1.3 \times 10^{-5}$ mol/min)
Trimethylindium ($5.6 \times 10^{-5}$ mol/min)
Arsine ($4.5 \times 10^{-3}$ mol/min)
Disilane as an n-type dopant ($2.2 \times 10^{-8}$ to $2.5 \times 10^{-8}$ mol/min)

A semiconductor substrate for HEMT was prepared by laminating layer 1 to layer 5 in this order on the GaAs substrate under the conditions shown in Table 1 below. The schematic sectional view of the semiconductor substrate is shown in FIG. 1. In FIG. 1, numerals 1 to 5 denote Layers 1 to 5, respectively, and numeral 6 denotes the GaAs substrate.

The thermal decompositions of the starting materials were carried out at a pressure of 76 Torr using 45 liters/minute of hydrogen gas purified by permeating through a palladium membrane as a carrier gas.

In Table 1 below, trimethylgallium, trimethylaluminum, and trimethylindium are shown as TMG, TMA, and TMI, respectively.

The $In_{0.20}Ga_{0.80}As$ layer of 12 nm in thickness as Layer 2 had the composition within the elastic deformation limit and the layer thickness given by formula (1) described above. Upon growing Layer 2 and Layer 3, the GaAs layer (Layer 3) of 2 nm in thickness was grown without substantially interrupting crystal growing after growing Layer 2 by the manner in that the supply of trimethylindium was stopped and while continuously supplying trimethylgallium.

TABLE 1

| Layer | Constitution | Layer thickness | Growing temperature (°C.) | Starting material |
|---|---|---|---|---|
| Layer 1 | Buffer layer: Non-doped GaAs | 0.5 μm | 700 | TMG Arsine |
| Layer 2 | Channel layer: $In_{0.20}Ga_{0.80}As$ | 12 nm | 600 | TMG TMI Arsine |
| Layer 3 | Semiconductor layer: GaAs | 2 nm | 600 | TMG Arsine |
| Layer 4 | Electron donating layer: n-$Al_{0.20}Ga_{0.80}As$ (doped amount: n = $2 \times 10^{18}$ cm$^{-3}$) | 50 nm | 700 | TMG TMA Arsine Disilane |
| Layer 5 | N-GaAs | 80 nm | 700 | TMG Arsine Disilane |

Figure 4:
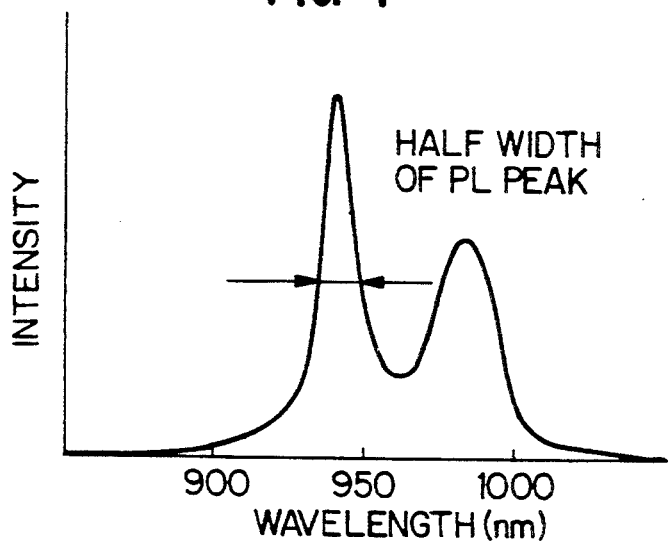
FIG. 4 is a graph showing a photoluminescence emission peak spectrum.

The two dimensional electron gas mobility at 77K of the resulting semiconductor substrate obtained was evaluated by a Hall measurement, and found to be 25,000 cm$^2$/Vs. The half width of photoluminescent emission peak (hereinafter referred to as "PL peak") observed in the wavelength range of from 920 to 950 nm measurable by 77K in the PL peaks was 19.7 meV. The half width of PL peaks is the energy width of the range that the PL emission intensity becomes ½ as shown in FIG. 4. It shows the flatness of the InGaAs layer, and as the value is large, the flatness is inferior.

COMPARATIVE EXAMPLE 1

Figure 2:
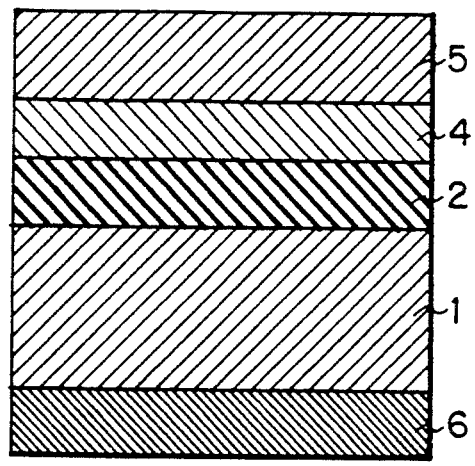
FIG. 2 is an enlarged schematic cross sectional view showing the semiconductor epitaxial substrate prepared in Comparative Example 1.
Figure 3:
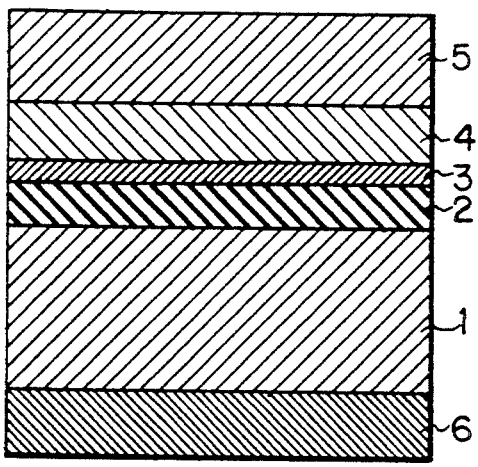
FIG. 3 is an enlarged schematic cross sectional view showing the semiconductor epitaxial substrate prepared in Comparative Example 2.

A semiconductor substrate was prepared by following the same procedure as Example 1 except that the growth of the $In_{0.20}Ga_{0.80}As$ layer (Layer 2) was carried out at a substrate temperature of 700° C. and then the growth of the AlGaAs layer (Layer 4) which as an electron donating layer was carried out. The schematic sectional view of the semiconductor substrate is shown in FIG. 2. The two dimensional electron gas mobility at 77K was evaluated by a Hall measurement and found to be 9,700 cm$^2$/Vs. The half width of the PL peak was 31.8 meV. The cross section of the crystals was observed by transmission electron microscope (TEM) of a high resolving power, and a wavy unevenness arranged in one direction was observed on the surface of the InGaAs crystal. The period of the wavy unevenness was from 200 to 400 nm and the height of the unevenness was 2 nm or higher.

COMPARATIVE EXAMPLE 2

A semiconductor substrate was prepared following the same procedure as Example 1 except that the growth of the $In_{0.20}Ga_{0.80}As$ layer (Layer 2) was carried out at a substrate temperature of 600° C. and after changing the substrate temperature to 700° C., the growth of the GaAs layer (Layer 3) was carried out. The schematic sectional view of the semiconductor substrate is shown in FIG. 2. The two dimensional electron gas mobility of the crystals at 77K was evaluated by a Hall measurement and found to be 17,500 cm$^2$/Vs. The half width of the PL peak was 31.3 meV. The cross section of the crystals was observed by TEM, and a wavy unevenness arranged in one direction was observed on the surface of the InGaAs crystal. The period thereof was from 200 to 400 nm and the height of the unevenness was 2 nm or higher.

By using the epitaxial substrate of the present invention, a large amount of electron elements having good characteristics can be produced at a low cost in various kinds of electron elements using an InGaAs layer formed on a GaAs substrate, and thus the industrial significance thereof is very large.

The semiconductor epitaxial substrate of the present invention is excellent in the flatness of the interface between the channel InGaAs layer and the electron donating layer as compared with conventional ones and has a high electron mobility as compared with conventional crystals, whereby highly improved device characteristics can be expected.

When the semiconductor epitaxial substrate is used for a field effect transistor in which $In_yGa_{(1-y)}As$ ($0 < y \leq 1$) used as a channel layer, an HEMT having an excellent performance without deterioration of the two dimensional electron gas mobility by unevenness at the growing interface of the channel layer can be prepared.

While the invention has been described in detail and with reference to specific examples thereof, it will be apparent to one skilled in the art that various changes and modifications can be made therein without departing from the spirit and scope thereof.

What is claimed is:

1. A process for producing a semiconductor epitaxial substrate comprising a GaAs single-crystal substrate having thereon an $In_yGa_{(1-y)}As$ ($0 < y \leq 1$) crystal layer as a channel layer, the composition and the thickness of said $In_yGa_{(1-y)}As$ layer being in the ranges within the elastic deformation limit of crystals constituting said In$_y$Ga$_{(1-y)}$As layer and the vicinity of said In$_y$Ga$_{(1-y)}$As layer, said semiconductor epitaxial substrate further comprising a semiconductor layer between said channel layer and an electron donating layer for supplying electrons to said channel layer, said semiconductor layer having a thickness of from 0.5 to 5 nm and a bandgap width within the range of from the bandgap width of GaAs to the bandgap width of said electron donating layer, said process comprising the steps of: epitaxially growing said channel layer and said semiconductor layer at a temperature of not higher than 625° C. and epitaxially growing said electron donating layer at a temperature of at least 650° C.

2. A process as claimed in claim 1, wherein said semiconductor layer is a GaAs layer.

3. A process as claimed in claim 1, wherein the thickness of said semiconductor layer is from 1 to 3 nm.

4. A process as claimed in claim 1, wherein said electron donating layer is an Al$_x$Ga$_{(1-x)}$As ($0<x\leq 1$) layer.

5. A process as claimed in claim 1, wherein said epitaxial growing is conducted by a vapor phase thermal decomposition method using an organometal and/or a metal hydride as a starting material.

6. A process as claimed in claim 1, wherein said epitaxially growth of said channel layer and said semiconductor layer is conducted at a temperature of not higher than 600° C. and said epitaxial growth of said electron donating layer is conducted at a temperature of at least 650° C.

7. A process as claimed in claim 1, wherein said channel layer and said semiconductor layer are continuously grown without interruption of crystal growth.

* * * * *